United States Patent
Amako et al.

(10) Patent No.: US 7,009,138 B2
(45) Date of Patent: Mar. 7, 2006

(54) LASER PROCESSING METHOD, LASER WELDING METHOD, AND LASER PROCESSING APPARATUS

(75) Inventors: Jun Amako, Matsumoto (JP); Susumu Kayamori, Matsumoto (JP)

(73) Assignee: Seiko Epson Corporation, (JP)

( * ) Notice: Subject to any disclaimer, the term of this patent is extended or adjusted under 35 U.S.C. 154(b) by 92 days.

(21) Appl. No.: 10/767,857

(22) Filed: Jan. 29, 2004

(65) Prior Publication Data

US 2005/0035102 A1    Feb. 17, 2005

(30) Foreign Application Priority Data

Feb. 3, 2003    (JP)    ............................ 2003-025557
Oct. 30, 2003    (JP)    ............................ 2003-369929

(51) Int. Cl.
B23K 26/22    (2006.01)
B23K 26/067    (2006.01)

(52) U.S. Cl. ............................. 219/121.64; 219/121.75
(58) Field of Classification Search ........... 219/121.63, 219/121.64, 121.75

See application file for complete search history.

(56) References Cited

U.S. PATENT DOCUMENTS 5,029,243 A    7/1991    Dammann et al.
5,998,758 A  *  12/1999   Moser et al. ........... 219/121.63
6,008,914 A    12/1999   Sasagawa et al.
6,635,849 B1   10/2003   Okawa et al.
2001/0054637 A1  12/2001  Hayakawa

FOREIGN PATENT DOCUMENTS

| JP | 08-279529 | 10/1996 |
|---|---|---|
| JP | 09-199845 | 7/1997 |
| JP | 10-256717 | 9/1998 |
| JP | 2002-001521 | 1/2002 |

* cited by examiner

*Primary Examiner*—Geoffrey S. Evans
(74) *Attorney, Agent, or Firm*—Harness, Dickey & Pierce, P.L.C.

(57) ABSTRACT

A processing method including steps for splitting a single beam into a plurality of beams including a zero-order diffracted beam, by diffracting the single beam by a diffractive element, for turning an array of focused beam spots obtained from the plurality of beams about the center of the zero-order diffracted beam according to the direction of an array of welding points where parts mounted on a circuit board are welded to the board, for causing a spot interval between focused beam spots in the array to agree with the interval between the plurality of welding points by adjusting the distance from the diffractive element to the board, and for increasing the intensity of the plurality of beams, to a welding intensity, and connecting the parts by simultaneously irradiating the welding points with the focused beam spots in the array having the determined direction and spot interval.

8 Claims, 5 Drawing Sheets

OPTICAL AXIS

LASER PROCESSING METHOD, LASER WELDING METHOD, AND LASER PROCESSING APPARATUS

BACKGROUND OF THE INVENTION

1. Field of the Invention

The present invention relates to processing using a laser beam, and to, for example, a method of mounting circuit parts on a printed circuit board by solder welding with lead free solder in particular using a laser, and the like.

2. Description of the Related Art

A method of mounting various types of parts (quartz oscillators, ICs, resistors, capacitors, etc.) on a printed circuit board by laser welding with solder is known. Although these various types of the parts are connected to the printed circuit board through the connecting terminals of the parts, the connection terminals of the parts are disposed with variations in orientation and interval. Accordingly, heretofore, the respective parts are connected to the printed circuit board by sequentially laser welding at a plurality of connecting portions in such a manner that connecting portions where solder is deposited are irradiated with a single laser beam one after another by moving the board or scanning the laser beam across the board (for example, refer to Japanese Unexamined Patent Application Publications Nos. 2002-1521, 10-256717, 09-199845, and 08-279529).

However, the known methods have the following drawbacks. That is, for irradiating processing portions (including welding portions) with a laser beam, a stage which carries the parts mounted atop a printed circuit board needs to be moved and turned arbitrarily in plane. However, such stage control is hardly practical when it comes to placing the laser welding into mass production lines. This is because it is terribly difficult to translate a heavy stage in a quick motion according to various directions and intervals of the connecting portions. Actually, printed circuit boards and parts to be mounted on the circuits are supplied in one direction in most mounting applications.

On the other hand, scanning the laser beam with a galvanometric mirror, can avoid the above problem. In this case, however, a space in which the mirror is placed is necessary in addition to the hardware and software cost of using the galvanometric mirror, which is a negative factor for making it difficult to introduce the laser joining technology into manufacturing settings. Further, since heating a plurality of processing portions sequentially by the laser beam irradiation adds to processing time as opposed to the case in which they are simultaneously heated by the laser beam irradiatation. Thus, a problem also arises in that a laser beam utilizing efficiency is rather limited due to the heat dispersion during the irradiation.

An object of the present invention, which was made to solve the above problems, is to provide a laser welding method and a laser welding apparatus capable of efficiently as well as effectively connecting various types of parts such as electronic parts and the like to a printed circuit board by a simple arrangement, so as to mount them on the board. Further, another object of the present invention is to provide a laser processing method and a laser processing apparatus that employs the same principle as that of the above welding method is applied to other kinds of processing such as drilling, cutting, texturing and modifying and the like and that allows laser irradiation points to be easily targeted during the above processing.

SUMMARY OF THE INVENTION

A laser processing method of the present invention comprises a beam-splitting step for splitting a single laser beam into a plurality of laser beams including a zero-order diffracted laser beam, by diffracting the single laser beam by a diffractive optical element; a direction setting step of turning an array of focused beam spots obtained from the plurality of laser beams about the zero-order laser beam, in accordance with the direction of an array of a plurality of processing points on a workpiece, an interval setting step for causing an interval between the arrayed beam spots to be in agreement with an interval between the arrayed processing points, by adjusting the distance from the diffractive optical element to the workpiece; and a processing step for increasing the intensity of the plurality of laser beams to a point that is enough high to process the workpiece, and processing the workpiece by simultaneously irradiating the plurality of processing points with the focused beam spots having the direction and the interval determined in the preceeding steps.

According to the method, the following effects can be achieved in the processing of a workpiece such as welding, removal, modification, and the like thereof:

(1) a plurality of portions in one processing line can be simultaneously processed by a compact and convenient optical system;

(2) each of arrayed processing points having a different direction and a different interval between the processing points can be easily processed only by turning the diffractive optical element and adjusting the height thereof;

(3) parts mounted in the vicinity of a processing portion can be prevented from being adversely affected by laser irradiation heat; and (4) a processing apparatus for mass production can be simply arranged.

A laser welding method of the present invention comprises: a beam-splitting step for splitting a single laser beam into a plurality of laser beams including a zero-order diffracted laser beam, by diffracting the single laser beam by a diffractive optical element; a direction setting step of turning an array of focused beam spots obtained from the plurality of laser beams about the zero-order laser beam, in accordance with the direction of an array of a plurality of welding points at which parts mounted on a printed circuit board are welded to the board; an interval setting step for causing an interval between the arrayed beam spots to be in agreement with an interval between the plurality of welding points by adjusting the distance from the diffractive optical element to the board; and a connecting step for increasing the intensity of the plurality of laser beams to a point that is enough high for welding, and connecting the parts to the board by simultaneously irradiating the plurality of welding points with the focused beam spots having the direction and the interval determined in the proceeding steps. With the above method, the same effects as those (1) to (4) described above can be also obtained during mounting parts on a printed circuit board.

In the above method, it is preferable to execute the respective setting steps after the zero-order laser beam, which has passed through the diffractive optical element, is caused to be in agreement with one of the processing points. Consequently, workability and accuracy can be improved because parts can be processed and welded at once after the direction and the interval of the array of focused beam spots are set as desired. Note that the present invention may be implemented with solder, in particular, lead free solder.

A laser processing apparatus of the present invention comprises a laser oscillator, a diffractive optical element for splitting a single laser beam emitted from the laser oscillator into a plurality of laser beams that include a zero-order diffracted laser beam and are used in processing, a turning unit for setting the diffractive optical element at a desired angle about the optical axis thereof, and a moving unit for moving the diffractive optical element by a desired distance in the optical axis direction thereof. According to the above arrangement, the laser processing apparatus can be simply arranged, and further when a plurality of processing points are located at a predetermined interval in a predetermined direction, these processing points can be processed at the same time. Further, arrayed processing points having different directions and intervals can be easily processed only by turning the diffractive optical element and adjusting the height thereof.

Further, the laser processing apparatus may comprise an optical axis positioning unit for locating the diffractive optical element in unison with the laser beam incident on it in a direction orthogonal to the optical axis. According to the above arrangement, since the zero-order laser beam split by the diffractive optical element can be caused to be in agreement with an arbitrary processing point, a pivotal position for laser beam registration can be easily obtained, and thus the laser processing apparatus can easily be arranged to deal with any processing points within a target region of a workpiece.

Further, the laser processing apparatus may comprise a solder dispenser for supplying solder to laser irradiation points on the workpiece. With the above arrangement, the laser energy efficiency of solder welding can be improved.

DESCRIPTION OF THE PREFERRED EMBODIMENTS

In the present invention, a zero-order beam is definitely included in an array of focused beam spots (a beam spot array) obtained from a plurality of laser beams (split laser beams) split by a diffractive optical element. The zero-order beam, in principle, is focused on an optical axis regardless of the direction and the length of a beam spot array. Therefore, the zero-order beam can be located at the same position on a processing surface even if the diffractive optical element is turned or its height position is changed on the optical axis. With the above property of the zero-order beam, it is possible to easily adjust the direction and the length of the beam spot array generated by the diffractive optical element by utilizing the position of the zero-order beam as a reference. Note that, in the present invention, it is possible to use the zero-order beam with another order beam or beams, which are arbitrarily chosen. The present invention will be explained below in detail with reference to an embodiment.

Figure 1:
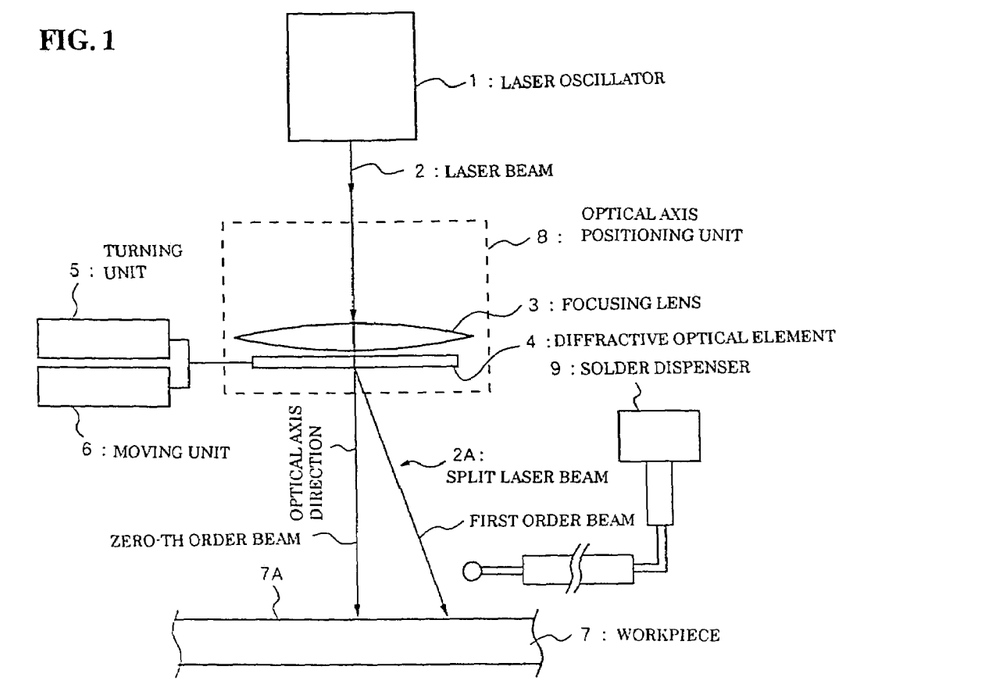
FIG. 1 is a view showing the basic arrangement of a laser processing apparatus according to an embodiment of the present invention.

FIG. 1 is a view showing the basic arrangement of a laser processing apparatus according to the embodiment of the present invention. The laser processing apparatus includes a laser oscillator 1 for generating laser beams, a focusing lens 3 as a focusing unit for focusing a laser beam 2 output from the laser oscillator 1, a diffractive optical element 4 such as a phase grating and the like, a turning unit 5, and a moving unit 6. The diffractive optical element 4 diffracts the single laser beam 2 focused by the focusing lens 3 and creates a plurality of split laser beams 2A, the turning unit 5 turns the diffractive optical element 4 on a plane across the optical axis thereof about the optical axis, and the moving unit 6 moves (here, vertically) the diffractive optical element 4 in the optical axis direction thereof. Here, a conventional unit such as a θ-stage is used as the turning unit 5, and a conventional unit such as a Z-stage is used as the moving unit 6.

Further, it is preferable that the laser processing apparatus includes an optical axis positioning unit 8 for positioning an optical system, which includes the elements from the laser oscillator 1 or a laser irradiation head (not shown) attached behind the laser oscillator 1 to the diffractive optical element 4, in a direction across the optical axis. Further, the laser processing apparatus may be provided with a dispenser 9 for supplying solder to a laser irradiating position, if needed. Note that the focusing unit is not limited to a lens and may be composed of other elements that can focus a laser beam.

Figure 2:
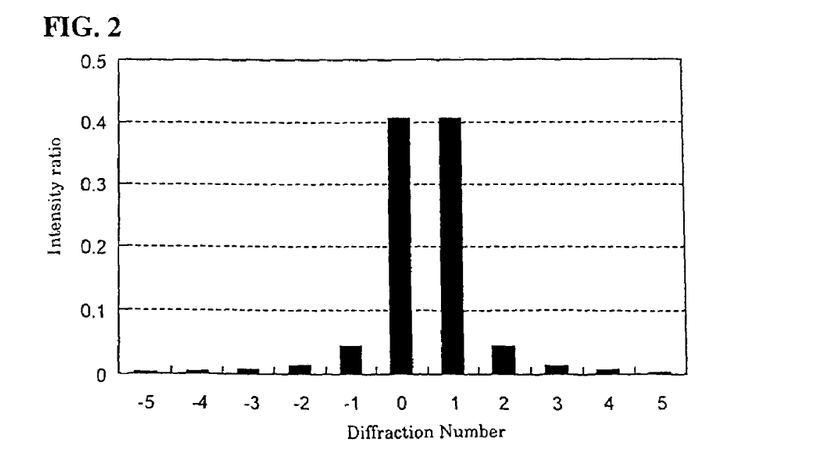
FIG. 2 is a graph showing the relationship between the diffraction order and the intensity of laser beams diffracted by a diffractiive optical element 4.

Next, the operation of the laser processing apparatus will be described. It is assumed here that the laser processing apparatus is provided with the diffractive optical element 4 that is designed such that two split laser beams used for processing have such diffraction orders and beam intensities as shown in FIG. 2. The laser beam 2 emitted from the laser oscillator 1 is focused by the focusing lens 3 and incident on the diffractive optical element 4. The diffractive optical element 4 splits the single laser beam incident on it into a plurality of split laser beams as shown in FIG. 2 and forms an array of the focused beam spots from the plurality of split laser beams.

Up to now, the direction of the beam spot array formed by the diffractive optical element 4 is not in agreement with that of a plurality of processing points on a workpiece 7, and further the interval of the beam spot array is not in agreement with that of the processing points. Thus, the following adjustments need to be executed.

Figure 3:
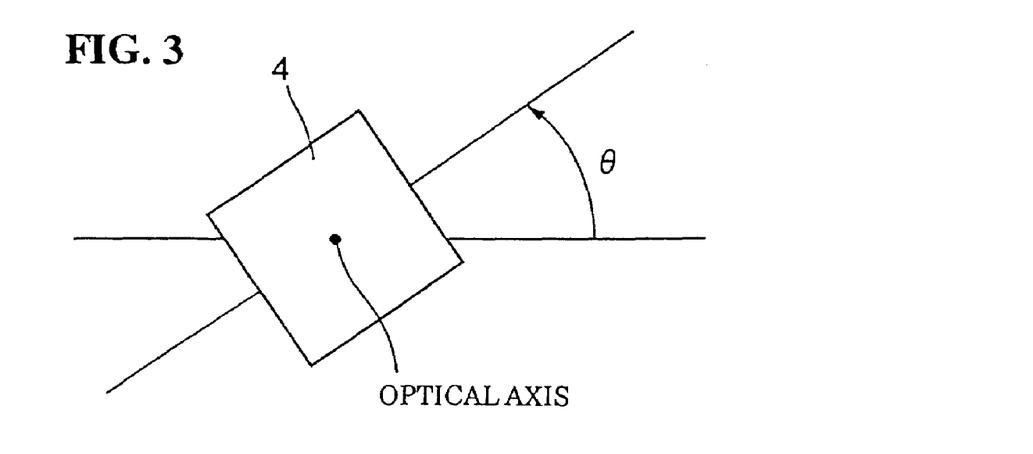
FIG. 3 is a view explaining the rotation of the diffractive optical element about an optical axis.
Figure 5:
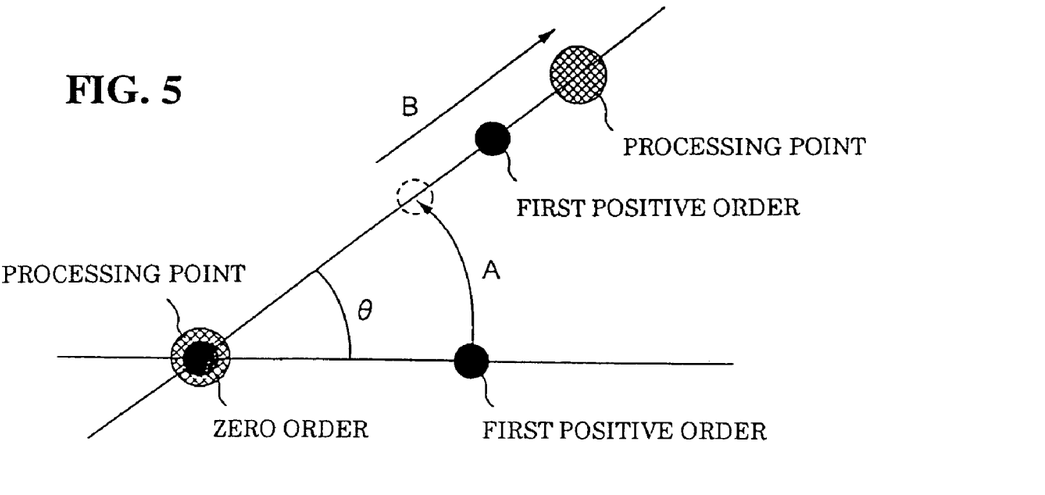
FIG. 5 is a view explaining the adjustment of irradiating positions with a plurality of laser beams obtained by the diffractive optical element.

First, a reference position is determined by causing the zero-order beam, which has passed through the diffractive optical element 4, to be in agreement with one processing points that constitute an array of processing points set to on the workpiece 7. Subsequently, as shown in FIG. 3, the beam spot array is turned by turning the diffractive optical element 4 by the turning unit 5 about the optical axis of the element 4 in a plane orthogonal to across the optical axis so that the direction of the beam spot array is in agreement with that of the processing point array of the workpiece 7. When, for example, the diffractive optical element 4 is set at an angle θ by turning it about the optical axis, the beam spot array is also turned by an angle θ. With the above operation, a focused beam spot of a first positive order diffracted beam is positioned as shown with an arrow A in FIG. 5.

Figure 4:
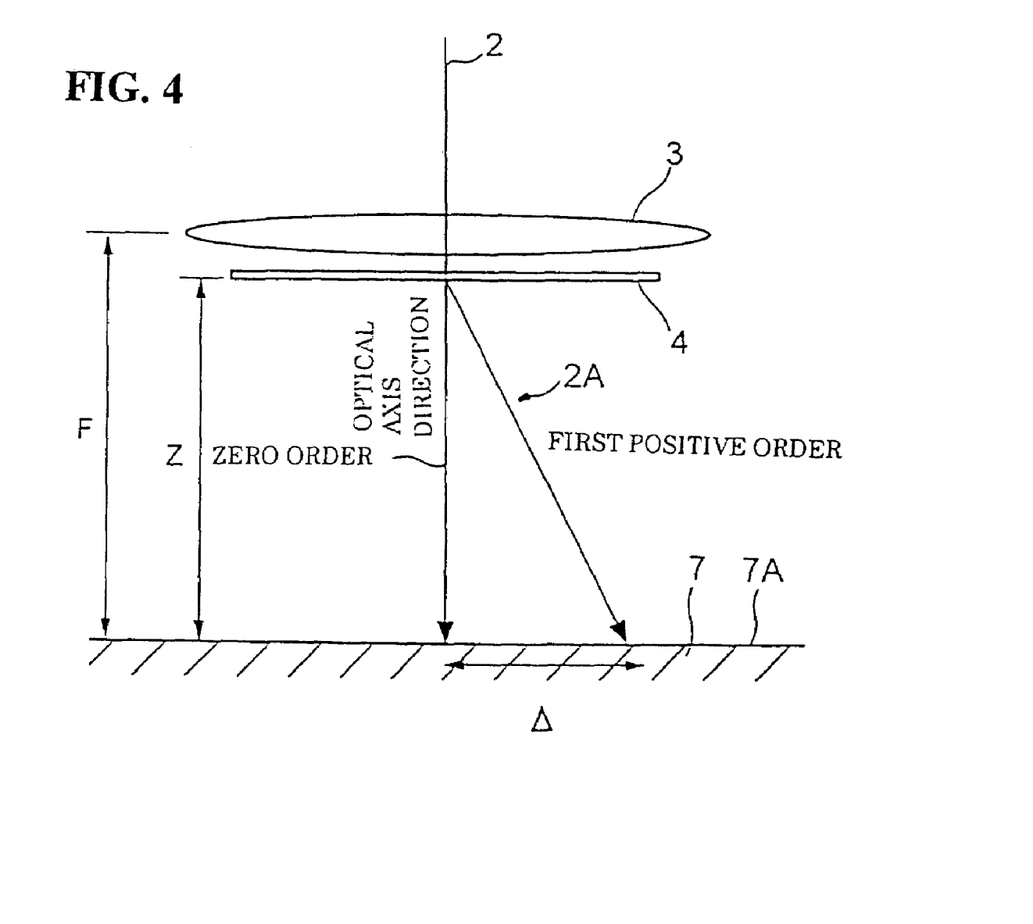
FIG. 4 is a view explaining the positioning of the diffractive optical element in an optical axis direction.

Next, as shown in FIG. 4, the interval of the beam spot array is caused to be in agreement with that of the processing point array by adjusting the distance from the diffractive optical element 4 to the surface 7A of a workpiece 7 (or surface to be welded), using the moving unit 6. With the above operation, the focused beam spot formed by the first positive order diffracted beam is positioned as shown by an arrow B in FIG. 5. With the adjustments explained with reference to FIGS. 3 and 4, the direction and the interval of the array of the focused beam spots formed by the plurality of laser beams split by the diffractive optical element 4 are in agreement with those of the processing point array formed by the plurality of processing points.

It is possible to cause the respective spots of the beam spot array obtained from the laser beams split by the diffractive optical element 4 to be in agreement with the plurality of processing points of the workpiece 7 arranged by performing the above adjustments as to the diffractive optical element 4. Note that it is also possible to cause the direction and the interval of the beam spot array to be in agreement with those of the processing point array first and then to cause the respective focused beam spots to be in agreement with the respective processing points using the zero-order beam spot or any other order beam spot as a reference. However, it is preferable to cause the focused beam spot formed by the zero-order laser beam, which has passed through the diffractive optical element 4, to be in agreement with one of the processing points and then to cause the direction and and the interval of the array of focused beam spots to be in agreement with the counterparts of the array of processing points from the view point of workability and accuracy in the processing executed thereafter.

The relationship between the distance Z from the diffractive optical element 4 to the surface 7A of the workpiece 7 to be processed and the spacing A between the zero-order beam spot and the first positive order beam spot will be explained with reference to FIG. 4. The relationship between the distance Z and the spacing Δ is given approximately by the following quation.

$$\Delta = (Z/Z\text{max})\Delta\text{max} \quad (1)$$

where, Zmax is a maximum value of the distance Z, and Δmax is a maximum value of the spacing Δ. When, for example, Zmax=90 mm and Δmax is 1.1 mm, the spacing Δ can be varied between 0 mm and 1.1 mm by changing the distance Z over the range of 0 to 90 mm. When the laser processing apparatus is used for soldering parts onto a printed circuit board, the distance Z may appropriately be varied in the range of 45 to 90 mm from a practical standpoint. (Note that "solder" means lead-free solder among others.) In this case, the spacing Δ between the two focused beam spots can be varied from 0.55 to 1.1 mm. If the spacing Δ is adjustable in as wide a range as mentioned above, the laser processing apparatus can be effectively used for laser welding of parts onto a printed circuit board. If it is desirable to further widen the spacing Δ between the beam spots, the distance Zmax from the diffractive optical element 4 to the workpiece's surface 7A needs to be elongated. On the other hand, if the spacing Δ between the beam spots is desired to be narrowed, the distanced Z should be decreased.

The diffractive optical element 4 used in this embodiment is a one-dimensional relief grating that has a sawtooth-shaped cross section. The grating is formed on a fused silica substrate, which is sufficiently transparent at a wavelength chosen for use, by photolithography and dry etching. The period of the grating is determined by the following equation.

$$d = \lambda Z\text{max}/\Delta\text{max} \quad (2)$$

where for example, d=66.1 μm for λ=0.808 μm; Zmax=90 mm, and Δmax is =1.1 mm. Further, the beam intensity of the each diffraction order of the grating is given by the following equations.

$$I_0 = \sin^2(\phi/2)/(\phi/2)^2 \quad (3\text{-}1)$$

$$I_m = \sin^2[(2\pi m - \phi)/2]/[(2\pi m - \phi)/2]^2 \quad (3\text{-}2)$$

where $I_0$ and $I_m$ represent the zero-order beam intensity and the m-th order beam intensity respectively, and φ shows the phase modulation depth of the grating; φ=2πh(n−1)/λ where n is the refractive index of a material and h is the depth of the grating. For example, as shown in FIG. 1, when two split laser beams that have an almost equal intensity are used for processing, an optimal phase modulation depth can be derived from the equations (3-1) and (3-2) as φ=π. In this case, the diffraction intensities can be determined from the following equations.

$$I_0 = (2/\pi)^2 \quad (4\text{-}1)$$

$$I_m = [2/(2m-1)\pi]^2 \quad (4\text{-}2)$$

FIG. 2 shows the relationship between the diffraction order and the beam intensity of diffraction laser beams calculated using the equations (3-1) and (3-2). According to FIG. 2, the zero-order beam and the first positive order beam have the same intensity of 0.405. As to the other intensity, a first negative order beam and a second positive order beam have the same intensity of 0.045, and a second negative order beam and a third positive order beam have the same intensity of 0.016. With the above intensity, a laser utilization efficiency in solder welding is expected to be 81% that is sufficiently high from a practical standpoint. Since the intensities of the zero and first positive order beams used in solder welding are nine times or more higher than those of the other beams, there is no possibility that diffraction beams other than the zero and first positive order beams damage the surrownding areas around joint portions in consideration of a beam intensity necessary for solder welding.

Further, an optimal depth h of the grating is determined from the following equation.

$$h = \phi\lambda/[2\pi(n-1)] \quad (5)$$

where, h=0.898 μm for φ=π and n=1.45.

Although the two split laser beams having the same intensity are used for laser soldering in the above-mentioned example, the intensity ratio between the two beams can be determined and varied from the design of the diffractive optical element, as needed.

Figure 6:
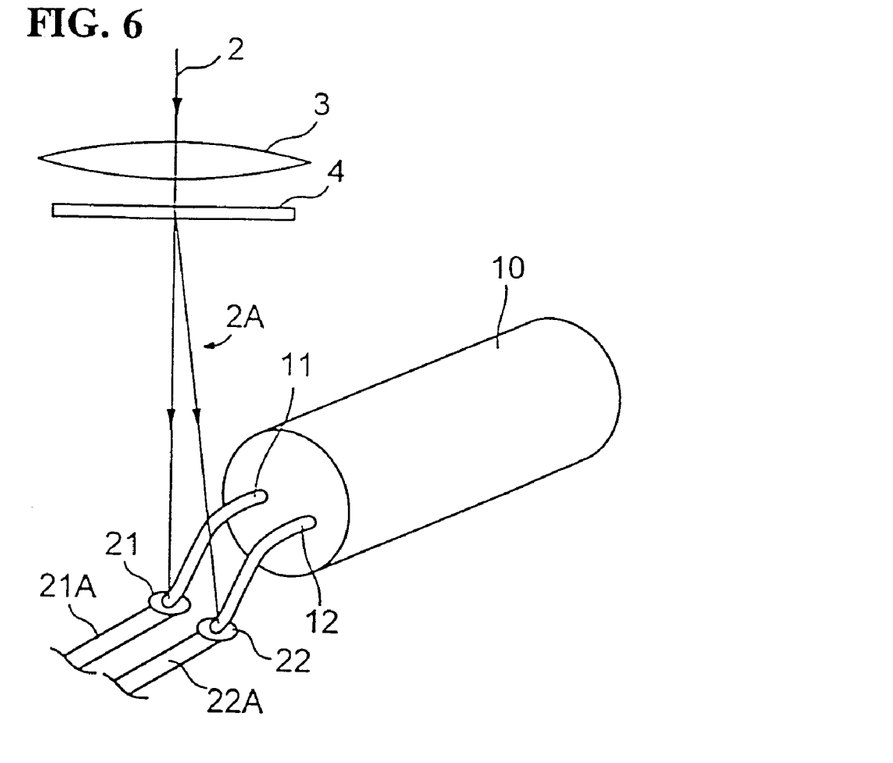
FIG. 6 is a view explaining laser welding of a quartz oscillator with two connection terminals to a printed circuit board.

FIG. 6 is a view exemplifying a method of mounting a quartz oscillator 10 on a circuit board. This is an example that the quartz oscillator 10 has two connection pins 11 and 12, and these connection pins 11 and 12 are inserted into terminals 21 and 22 on the board and connected thereto by solder welding. The terminals 21 and 22 used in the experiment has an interval of 0.80 mm, and the printed circuits 21A and 22A of the terminals are 0.30 mm wide. To connect the quartz oscillator 10 to the board, first, the laser beam intensity is adjusted appropriately to be so low as not to damage the board and the parts mounted thereon. Then, any one of the terminals 21 and 22 is caused to be in agreement with the focused beam spot formed from the zero-order laser beam, which has passed through the diffractive optical element 4, making use of the optical axis positioning unit 8, and the like. Subsequently, the direction and the interval of the array of the focused beam spots formed from the split laser beams 2A are caused to be in agreement with those of the array of the terminals 21 and 22 using the above-described method. Next, a solder is supplied to the connecting portions of the respective terminals 21 and 22 by a solder dispenser 9 set in the laser processing apparatus. Then, the intensity of the two split laser beams 2A, in which the position, the direction and the interval of the array of the focused beam spots formed thereby are caused to be in agreement with those of the array of the terminals 21 and 22 as described above, is raised by adjusting the output of the laser oscillator 1 up to a point that enables target processing to be executed. By doing so the split laser beams 2A are able to melt the solder. The connecting portions are simultaneously irradiated with the two split laser beams 2A whose intensity has been increased until the solder melts to thereby connect the connection pins 11 and 12 to the terminals 21 and 22 by welding. With the above operation, the quartz oscillator 10 is connected to the board. According to the above method, since the solder is simultaneously heated at the two independent portions, the solder is melted and aggregated without problem. Particularly in the case where the solder welding portions are located close to each other as described above, if they are irradiated and heated with a single beam one by one, the solder at one portion under the laser irradiation heats up and tends to fuse with the solder at the other portion, meaning that the circuits may be short-circuited. This phenomenon may be also caused when the solders at the two welding portions are irradiated and heated alternately by scanning the beam because the scanning is executed at a limited speed. Such a problem can be also overcome by this embodiment.

Note that when a plurality of different quartz oscillators, resistors, capacitors and the like are mounted on the board, the directions and the intervals of the connection terminals of these parts may differ from each other. In this case, it is necessary to determine the position of the array of the focused beam spots to each of the positions where the quartz oscillators, the resistors, the capacitors, and the like are mounted. Further, when mounting parts, which are of the same type but have a different interval of pins, are jointed on the same board, the interval of the array of the focused beam spots must be adjusted by varying the distance between the diffractive optical element and the mounting board.

Figure 7:
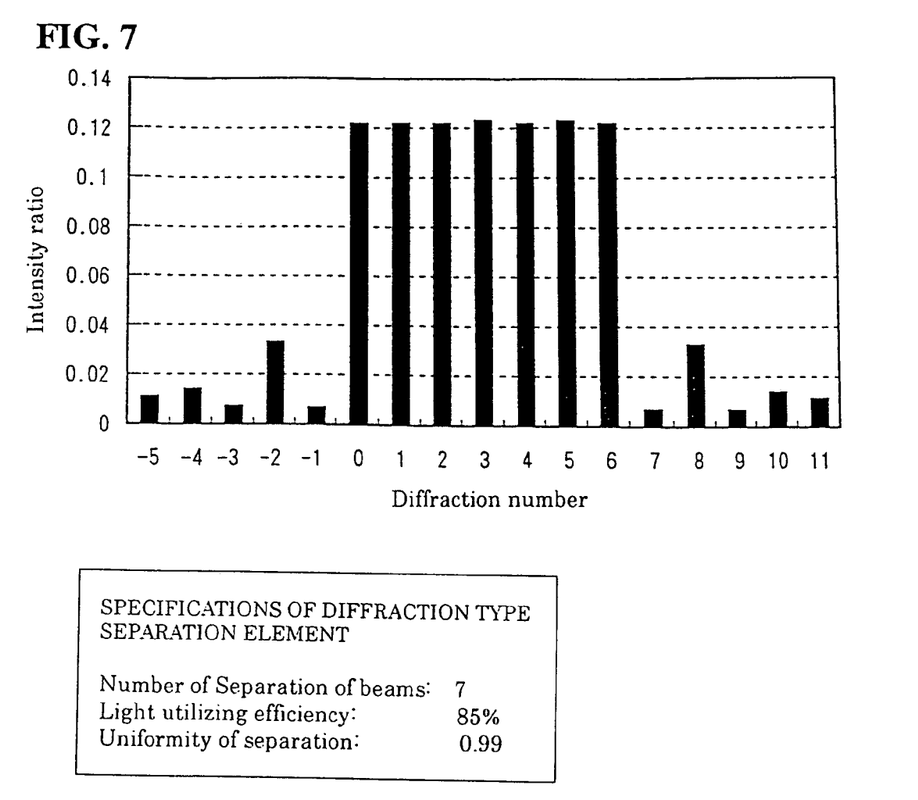
FIG. 7 is a graph showing the relationship between the diffraction order and the intensity of laser beams diffracted by a diffractive optical element 4A.

Although the case described above is an example that the two laser beams used in processing are generated making use of the beam splitting action of the diffractive optical element, it is possible to generate a desired number of processing laser beams depending on the design of the diffractive optical element For example, FIG. 7 is a graph showing the relationship between the diffraction order and the beam intensity of split laser beams generated by another diffractive optical element 4A. The diffractive optical element 4A generates an array of seven laser beams, which are composed of from zero-th to sixth positive order having an equally spaced interval by splitting a single laser beam. In this case, the laser utilizing efficiency of the seven split laser beams is about 85% and the uniformity of the seven split beams is about 0.99, which exhibits sufficiently practical values. Note that when the number of split of a laser beam is 3 or more, the diffractive optical element cannnot necessarily be realized in a saw-tooth shape and rather may be designed according to the necessary number of split of the laser beam and the distribution of intensity of the split laser beams. Accordingly, it is possible to use any one of positive or negative high order beams including a zero-order beam depending on the design of the diffractive optical element, and further it is also possible to more increase the laser utilization efficiency.

Figure 8:
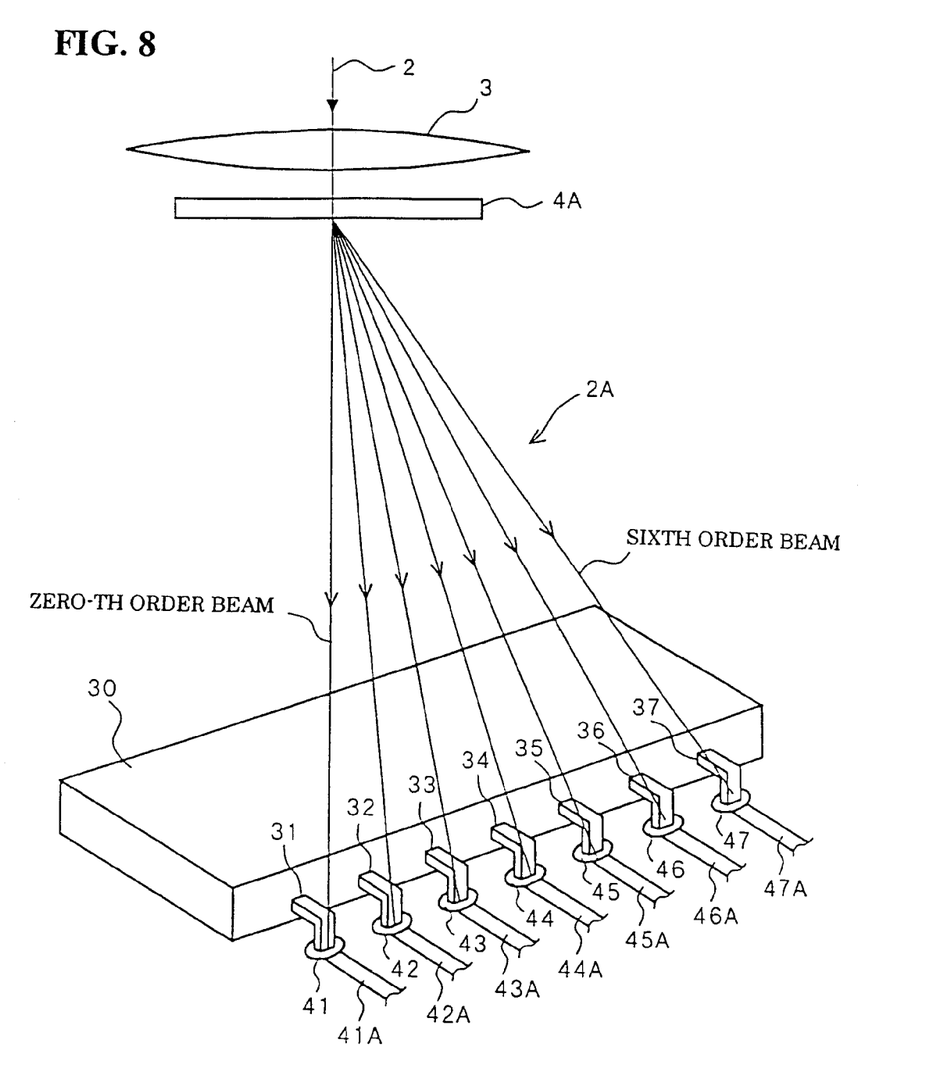
FIG. 8 is a view explaining laser welding of an IC with seven connection terminals on a side, to a printed circuit board.

FIG. 8 is a view exemplifying a case that a work is processed using the diffractive optical element 4A shown in the graph of FIG. 7. FIG. 8 shows an example that an IC 30 having connection pins 31 to 37 on one side are connected to a printed circuit board by laser soldering after inserting the pins 31 to 37 into the terminals 41 to 47 of the board corresponding thereto. Note that, in FIG. 8, reference numerals 41A to 47A denote printed circuits on the board that are connected to the respective terminals. Also in this case, the laser oscillator 1 emits a laser beam having low intensity so as not to damage the board and the parts mounted thereon. Then, a focused beam spot formed by a zero-order laser beam, which has passed through the diffractive optical element 4A, is caused to be in agreement with the one terminal 41 among others, preferably the leftmost terminal in this case, that constitute a terminal array using the optical axis positioning unit 8 and the like. Subsequently, the array of the focused beam spots formed by the seven split laser beams 2A generated by the diffractive optical element 4A is caused to be in agreement with the array direction of the terminal 41 to 47 by turning the diffractive optical element 4A about its optical axis. Further, the interval between the focused beam spots in the array is caused to be in agreement with the interval between the terminals 41 to 47 by moving the diffractive optical element 4A along an optical axis direction. Subsequently, a solder is supplied to the connecting portions of the terminals 41 to 47. Next, the intensity of the seven split laser beams 2A, in which the position, the direction and the interval of the array of the focused beam spots thereof are caused to be in agreement with those of the array of the terminals 41 to 47, is increased by adjusting the output of the laser oscillator 1, so that laser welding can be executed. Then, the connecting portions are simultaneously irradiated with the seven split laser beams 2A whose intensity has been increased until the solder is melted to thereby connect the seven connection pins 31 to 37 on the one side of the IC 30 to the terminals 41 to 47 by welding. Subsequently, a pin array on the other side of the IC 30 is also connected to the board likewise. According to the above processing, the welding can be very effectively executed at the fourteen portions without thermally affecting the parts in the vicinity of the IC 30.

In the laser connection technology of the present invention, a YAG laser (wavelength: 1.064 $\mu$m), a high-power semiconductor laser (wavelength: 0.808 $\mu$m, 0.940 $\mu$m) and the like can be used as a laser oscillator. Further, in processing applications other than solder welding, various types of laser oscillators can be used according to demand for tose processes. Note that, in the above embodiment, the intensity of the split laser beams 2A is varied by changing the output of the laser oscillator 1. However, the intensity of the split laser beams 2A may be varied by fixing the output of the laser oscillator 1 and using other kinds of laser beam intensity changing means such as an attenuator and the like disposed outside the laser oscillator 1. Further, while the example of laser processing using a one-dimensional array of split laser beams is exemplified in the above embodiment, the present invention can be also applied to processing using a two-dimensional array of split laser beams.

The laser processing technology of the present invention easily realizes a good positional agreement between split beams and processing points, which is a serious issue in mass production, by considering a combination of the zero-order beam with higher order beams split by a diffractive optical element, and thus the present invention can be widely applied to the case that the direction of an array of processing points and the interval of the processing points are different in respective processing arrays. Accordingly, the solder welding of the mounting parts that are referred to in the above embodiment are only one example to which the present invention is applied, and the present invention can be also applied to various processing applications as well as the solder welding, such as, welding other than the solder welding, removing processing (drilling, groove cutting), property modification processing (alloying, polymerization, refraction factor modulation). In such cases, the output and the irradiating time of laser may be appropriately determined according to a type of processing, when the processing points are simulatenously irradiatied with a plurality of split beams in which the positions, directions, and the interval of the array of focused beam spots are determined.

The entire disclosure of Japanese Patent Application Nos. 2003-025557 filed Feb. 3, 2003 and 2003-369929 filed Oct. 30, 2003 are incorporated by reference.

What is claimed is:

1. A laser processing method, comprising:
    a beam-splitting step for splitting a single laser beam into a plurality of laser beams including a zero-order diffracted laser beam, by diffracting the single laser beam by a diffractive optical element;
    a direction setting step of turning an array of focused beam spots obtained from the plurality of laser beams about the zero-order diffracted laser beam to align the array of focused beam spots in accordance with a direction of an array of a plurality of processing points of a work;
    an interval setting step for causing an interval between the focused beam spots in the array to be in agreement with an interval between the plurality of processing points in the array, by adjusting the distance from the diffractive optical element to the work; and
    a processing step for increasing the intensity of the plurality of laser beams to such an intensity that is necessary to process the work, and processing the work by simultaneously irradiating the plurality of processing points with the focused beam spots in the array having the direction and the interval determined in the preceeding steps;
    wherein the respective setting steps are executed after the zero-order diffracted laser beam, which has passed through the diffractive optical element, is caused to be in agreement with one of the processing points.

2. A laser welding method, comprising:
    a beam-splitting step for splitting a single laser beam into a plurality of laser beams including a zero-order diffracted laser beam by diffracting the single laser beam by a diffractive optical element;
    a direction setting step of turning an array of focused beam spots obtained from the plurality of laser beams about the zero-order diffracted laser beam in accordance with a direction of an array of a plurality of welding points at which parts mounted on a printed circuit board are welded to the board;
    an interval setting step for causing an interval between the focused beam spots in the array to be in agreement with an interval between the plurality of welding points in the array by adjusting the distance from the diffractive optical element to the board; and
    a connecting step for increasing the intensity of the plurality of laser beams to such an intensity that is necessary for welding, and connecting the parts to the board by simultaneously irradiating the plurality of welding points with the focused beam spots in the array having the direction and the interval determined in the preceeding steps.

3. A laser welding method according to claim 2, wherein the respective setting steps are executed after the zero-order diffracted laser beam, which has passed through the diffractive optical element, is caused to be in agreement with one of the welding points.

4. A laser welding method according to claim 2, wherein the connection is made by welding using a filler material.

5. A laser apparatus comprising:
    a laser oscillator;
    a diffractive optical element for splitting a single laser beam emitted from the laser oscillator into a plurality of laser beams that include a zero-order diffracted laser beam and are used in processing;
    a turning unit for setting the diffractive optical element at a a desired angle by turning it about the optical axis thereof; and
    a moving unit for positioning the diffractive optical element on the optical axis by sliding it over a desired distance along the optical axis;
    wherein:
        the diffractive optical element is one-dimensional relief grating;
        the zero-order diffracted laser beam is in alignment with the optical azis and in agreement with a processing point; and
        the moving unit positions the diffractive optical element such that the plurality of laser beams are in agreement with an interval between a plurality of processing points.

6. A laser processing apparatus according to claim 5, comprising a focusing unit for focusing a laser beam incident on the diffractive optical element.

7. A laser processing apparatus according to claim 5, comprising an optical axis positioning unit for moving the laser beam incident on the diffractive optical element together with the diffractive optical element in a direction orthogonal to across the optical axis.

8. A laser processing apparatus according to claim 5, comprising a solder dispenser for supplying solder to the laser irradiation points on a work.

* * * * *

UNITED STATES PATENT AND TRADEMARK OFFICE
CERTIFICATE OF CORRECTION

PATENT NO. : 7,009,138 B2 Page 1 of 1
APPLICATION NO. : 10/767857
DATED : March 7, 2006
INVENTOR(S) : Jun Amako and Susumu Kayamori It is certified that error appears in the above-identified patent and that said Letters Patent is hereby corrected as shown below:

| | |
|---|---|
| Column 2, Line 17: | "enough high" should be -- high enough -- |
| Column 2, Line 53: | "enough high" should be -- high enough -- |
| Column 3, Line 43: | "diffractiive" should be -- diffractive -- |
| Column 4, Line 63: | "points" should be -- point -- |
| Column 4, Line 63: | Delete "to" |
| Column 5, Line 36: | Delete 2$^{nd}$ occurrence of "and" |
| Column 5, Line 42: | "A" should be -- $\Delta$ -- |
| Column 5, Line 46: | "quation" should be -- equation -- |
| Column 6, Line 46: | "surrowing" should be -- surrounding -- |
| Column 9, Line 20: | "simultatenously irradiatied" should be -- simultaneously irradiated -- |
| Column 10, Line 32: | Delete 2$^{nd}$ occurrence of "a" |
| Column 10, Line 41: | "azis" should be -- axis -- |

Signed and Sealed this

Seventeenth Day of October, 2006

JON W. DUDAS
*Director of the United States Patent and Trademark Office*